United States Patent
Brekelmans (10) Patent No.: US 8,354,886 B2
(45) Date of Patent: Jan. 15, 2013

(54) ARRANGEMENT FOR CALIBRATING THE QUIESCENT OPERATING POINT OF A PUSH-PULL AMPLIFIER

(75) Inventor: Johannes Hubertus Antonius Brekelmans, Nederweert (NL)

(73) Assignee: NXP B.V., Eindhoven (NL)

(*) Notice: Subject to any disclaimer, the term of this patent is extended or adjusted under 35 U.S.C. 154(b) by 2 days.

(21) Appl. No.: 13/058,276

(22) PCT Filed: Aug. 10, 2009

(86) PCT No.: PCT/IB2009/053509
§ 371 (c)(1),
(2), (4) Date: Feb. 9, 2011

(87) PCT Pub. No.: WO2010/018528
PCT Pub. Date: Feb. 18, 2010

(65) Prior Publication Data
US 2011/0133839 A1 Jun. 9, 2011

(30) Foreign Application Priority Data
Aug. 11, 2008 (EP) .................................... 08162179

(51) Int. Cl.
*H03F 3/26* (2006.01)
(52) U.S. Cl. .......................................... 330/267
(58) Field of Classification Search ............ 330/264, 330/267, 269, 271
See application file for complete search history.

(56) References Cited

U.S. PATENT DOCUMENTS

| | | | |
|---|---|---|---|
| 2,851,542 A | | 9/1958 | Lohman |
| 3,914,702 A | * | 10/1975 | Gehweiler ................ 330/264 |
| 4,178,559 A | | 12/1979 | Nichols |
| 5,113,150 A | | 5/1992 | Waizman |
| 5,221,910 A | | 6/1993 | Tournier |
| 5,512,859 A | | 4/1996 | Moraveji |
| 5,537,079 A | | 7/1996 | Gosser et al. |
| 6,781,462 B2 | * | 8/2004 | Hwang et al. ............ 330/255 |
| 7,907,013 B2 | * | 3/2011 | Chuang .................... 330/267 |
| 2001/0020870 A1 | * | 9/2001 | Laaser .................... 330/264 |
| 2003/0076171 A1 | | 4/2003 | Hwang et al. |

FOREIGN PATENT DOCUMENTS

| | | |
|---|---|---|
| EP | 0 023 275 A1 | 2/1981 |
| EP | 1 734 653 A1 | 12/2006 |
| GB | 2 115 999 A | 9/1983 |

OTHER PUBLICATIONS

Koli, K. "CMOS Current Amplifiers: Speed vs. Nonlinearity," Thesis, Helsinki Univ. of Techn. Electronic Circuit Design Laboratory, Report 30, Espoo 2000, 305 pages (Nov. 13, 2000).
International Search Report and Written Opinion for Int'l. Patent Application, PCT/IB2009/053509 (Dec. 11, 2009).

* cited by examiner

*Primary Examiner* — Khanh V Nguyen (57) ABSTRACT

A signal processing arrangement comprises an amplifier (AMP V1) that includes a stage with complementary transistors (MP3, MN3) of opposite conductivity type arranged in series between two supply lines (+, −). A controllable biasing circuit (CCS) is provided for changing a quiescent operating point of the stage as a function of a control signal (CS). A control arrangement measures an even order 5 distortion of the amplifier (AMP V1) and adjusts the control signal (CS) so that the even order distortion is below a critical level.

13 Claims, 3 Drawing Sheets

ARRANGEMENT FOR CALIBRATING THE QUIESCENT OPERATING POINT OF A PUSH-PULL AMPLIFIER

FIELD OF THE INVENTION

The invention refers to a signal processing arrangement that comprises an amplifier with complementary transistors, which may be of, for example, the field effect type. The signal processing arrangement may be in the form of, for example, an integrated circuit for processing radiofrequency signals. Such an integrated circuit may be applied in, for example, a receiver system. Other aspects of the invention relate to a radiofrequency system, a method of signal processing and a computer program product.

BACKGROUND OF THE INVENTION

Signal processing arrangements typically comprise various functional entities for carrying out various types of operations. There is an ongoing trend to implement these functional entities by means of digital circuits rather than analog circuits, although analog circuits remain indispensable. There is also an ongoing trend to implement more and more functional entities on a single integrated circuit.

There is thus a need for combining analog circuits and digital circuits on a single integrated circuit. An integrated circuit that comprises digital circuits may be taken as a basis to which one or more analog circuits should be added. In a manner of speaking, analog circuits should adapt to integrated circuit manufacturing processes for digital circuits. Since digital circuits are typically manufactured in CMOS technology, there is a need for high-performance analog circuits that can be manufactured in CMOS technology (CMOS is an acronym for complementary metal-oxide semiconductor).

Numerous signal processing arrangements require an amplifier for amplifying analog signals. For example, in an integrated receiver system, a radiofrequency signal is typically amplified before digitizing this signal, or a frequency-converted version thereof. In such an integrated receiver system, functional entities such as, for example, filters, demodulators, and decoders, may be implemented by means of digital circuits. The digital circuits process a digital version of the radiofrequency signal obtained by digitization. This digital processing can be relatively precise. Receiver performance will substantially depend on analog signal processing, prior to the digitization, which involves amplification. For example, the amplifier should exhibit a sufficiently high degree of linearity so that distortion requirements are met.

An interesting amplifier topology, which can be manufactured in CMOS technology, is based on complementary transistors of opposite conductivity type, which are arranged in series between two supply lines. This amplifier topology is interesting because of its inherent structural simplicity, relatively low power consumption, and relatively high power gain. Moreover, this amplifier topology exhibits a relatively linear transfer function.

U.S. Pat. No. 3,914,702 describes a complementary field effect transistor amplifier, which is biased to a given operating point. To that end, a reference potential is applied to its input terminal. The operating potentials supplied to the amplifier are varied in accordance with its output signal. At least one other complementary field effect amplifier, which is integrated upon a common substrate with the first amplifier, receives operating potentials that also vary in accordance with the output signal of the first amplifier. This is done to maintain the quiescent operating point of the other amplifier at a value substantially equal to the given operating point of the first amplifier. The aforementioned patent dissuades use of a feedback resistor.

SUMMARY OF THE INVENTION

There is a need for a signal processing arrangement wherein an amplifier with complementary transistors can meet relatively stringent requirements in terms of distortion. The following points have been taken into consideration in order to better address this need.

An amplifier may comprise one or more stages with complementary transistors of opposite conductivity type, which are arranged in series between two supply lines, as mentioned hereinbefore. Ideally, the complementary transistors have substantially identical analog characteristics, apart from being of opposite sign. In this ideal case, even order distortion should be negligible or even zero. However, in practice, the complementary transistors are typically formed by means of different process steps. Process steps that are used to form a transistor of a given conductivity type may overlap with process steps that are used to the transistor of the opposite conductivity type, but there is no complete overlap. Consequently, it is difficult to achieve that the complementary transistors have substantially identical analog characteristics, apart from being of opposite sign.

Moreover, digital circuits may need to be formed jointly with the amplifier on a single integrated circuit substrate. The digital circuits may require that the complementary transistors are formed so that these transistors nominally have different analog characteristics. In addition, manufacturing tolerances may cause that the complementary transistors of a particular specimen have respective analog characteristics that differ to a relatively large extent. If nominally differences already exist, even greater differences may occur due to manufacturing tolerances. This may result in a significant degree of even order distortion.

In principle, distortion may be reduced by means of negative feedback: the aforementioned amplifier is provided with a feedback circuit. The greater the number of stages, the higher the degree of linearity the amplifier will exhibit and, consequently, the better the performance in terms of distortion. However, in radiofrequency applications, the number of stages will be limited to 2 or 3 for reasons of stability. It was found that even order distortion was still above an acceptable level in such applications, despite negative feedback and a three-stage configuration. Distortion could be reduced by lowering closed loop amplifier gain. However, this adversely affects other performance aspects such as, for example, sensitivity or signal to noise ratio, or both.

In accordance with an aspect of the invention, a signal processing arrangement comprises an amplifier that includes a stage with complementary transistors of opposite conductivity type arranged in series between two supply lines. A controllable biasing circuit is provided for changing a quiescent operating point of the stage as a function of a control signal. A control arrangement measures an even order distortion of the amplifier and adjusts the control signal so that the even order distortion is below a critical level.

A change in the quiescent operating point of the stage affects the analog characteristics of at least one complementary transistor with respect to those of the other. For example, in case a transistor of a given conductivity type experiences a change in its characteristics, the transistor of the opposite conductivity type may experience an opposite change in its characteristics. Accordingly, it is possible to compensate for a nominal difference between the respective analog characteristics of the complementary transistors, which nominal difference may be due to design considerations and manufacturing tolerances. The control arrangement carries out this compensation on the basis of an even-order distortion measurement. Even-order distortion can thus be reduced without jeopardizing stability, sensitivity, signal to noise ratio, or other performance aspects. This is particularly true for radiofrequency applications where, for example, signals in VHF and UHF frequency ranges need to be processed.

An implementation of the invention advantageously comprises one or more of the following additional features, which are described in separate paragraphs that correspond with individual dependent claims.

Preferably, a controller is provided that can set the signal processing arrangement in a calibration mode and a standard mode. In the calibration mode, the control arrangement is allowed to adjust the control signal. In the standard mode, the control signal is maintained at a value for which the even order distortion is below the critical level.

A test signal that is used for measuring even order distortion may comprise a frequency that is several orders of magnitude lower than that of a typical signal, which the amplifier has to amplify.

The controllable biasing circuit may comprise a controllable current source for applying a controllable offset current to a signal node of the amplifier.

The controllable biasing circuit may comprise at least one controllable biasing element arranged in series with the two complementary transistors between the two supply lines, so as to impose a controllable difference between respective biasing voltages across the two respective complementary transistors.

The amplifier preferably comprises a feedback circuit.

The feedback circuit may comprise a resistance coupled between an output and an input of the amplifier. In that case, the controllable biasing circuit may comprise a controllable current source for applying a controllable offset current to the input of the amplifier.

The amplifier preferably comprises three stages: an input stage, an intermediate stage, and an output stage, each with complementary transistors of opposite conductivity type arranged in series between two supply lines. The controllable biasing circuit changes the quiescent operating point of the output stage as a function of the control signal.

Preferably, at least one of the aforementioned stages is provided with a local feedback circuit that comprises a resistance and a capacitance coupled in series. A detailed description, with reference to drawings, illustrates the invention summarized hereinbefore as well as the additional features.

DETAILED DESCRIPTION OF THE INVENTION

Figure 1:
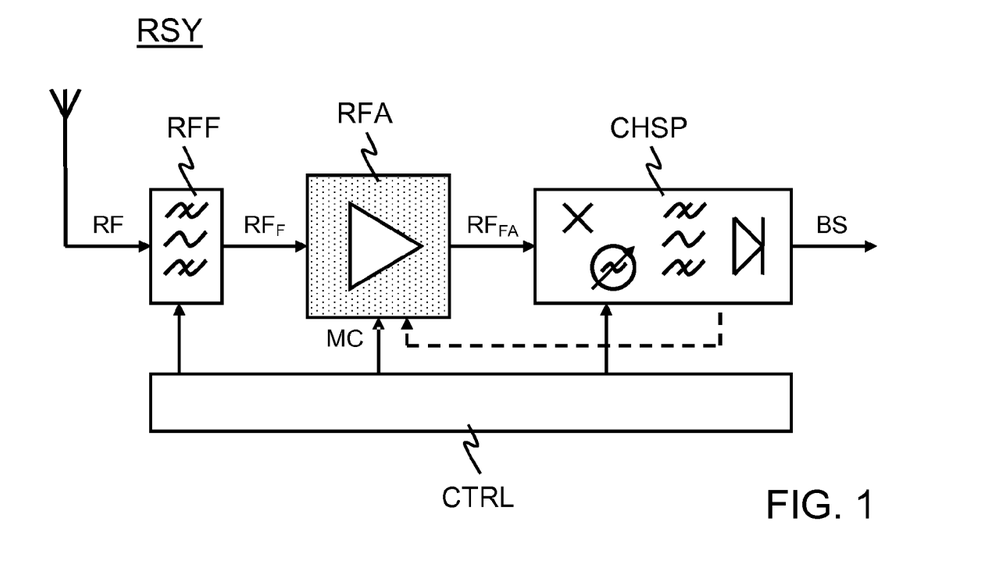
FIG. 1 is a block diagram that illustrates a receiver system, which comprises a radiofrequency amplifier.

FIG. 1 illustrates a receiver system RSY, which may form part of, for example, a video set, a set-top box, a personal computer, a digital video recorder, a wireless communication apparatus, or the like. The receiver system RSY comprises a radiofrequency filter RFF, a radiofrequency amplifier RFA, a channel selection-and-processing arrangement CHSP, and a controller CTRL. The radiofrequency amplifier RFA may form part of an integrated circuit, which may further comprise functional entities that belong to the channel selection-and-processing arrangement CHSP. The channel selection-and-processing arrangement CHSP may comprise digital circuits, which may be formed on the same integrated circuit as the radiofrequency amplifier RFA. The controller CTRL is typically implemented by means of a suitably programmed processor. The controller CTRL may include a user interface by means of which a user can select a desired channel.

In a standard mode of operation, the receiver system RSY derives a baseband signal BS from a desired channel in a radiofrequency signal RF, which the receiver system RSY receives. In more detail, the radiofrequency filter RFF suppresses channels that are outside a frequency band of interest. The radiofrequency filter RFF provides a filtered radiofrequency signal $RF_F$, which comprises the desired channel and other channels that may be present in the frequency band frequency band of interest. The radiofrequency filter RFF may be switched from one frequency band to another frequency band by means of a band control signal, which the controller CTRL may provide. Frequency bands of interest may be, for example, VHF frequency bands and UHF frequency bands, as well as bands of higher frequency, VHF and UHF being acronyms for Very High Frequency and Ultra High Frequency, respectively.

In the standard mode of operation, the radiofrequency amplifier RFA amplifies the filtered radiofrequency signal $RF_F$. The radiofrequency amplifier RFA may have a fixed gain or a variable gain. The radiofrequency amplifier RFA applies a filtered-and-amplified radiofrequency signal $RF_{FA}$, which has an appropriate signal power, to the channel selection-and-processing arrangement CHSP.

The channel selection-and-processing arrangement CHSP suppresses any signals in the filtered-and-amplified radiofrequency signal $RF_{FA}$ that are outside the desired channel. To that end, the channel selection-and-processing arrangement CHSP may comprise a frequency converter followed by a channel selection filter, which has a particular pass band. The frequency converter carries out a frequency shift so that the desired channel falls within the pass band of the channel selection filter. The frequency shift may be adjusted by means of a tuning signal, which the controller CTRL provides, so that the channel selection-and-processing arrangement CHSP is tuned to the desired channel. A demodulator derives the baseband signal from a signal within the desired channel, which has been pass-band filtered. The baseband signal may undergo further processing, which may include, for example, channel decoding, error correction, and baseband decoding, such as, for example, MPEG 2 decoding.

The radiofrequency amplifier RFA is a critical element of the receiver system RSY in terms of quality of reception and manufacturing cost. In practice, the radiofrequency amplifier RFA has a transfer function that is not perfectly linear. The transfer function has even order nonlinear terms and odd order nonlinear terms. These nonlinear terms may cause two signals that are outside the desired channel to produce an interfering signal, which may fall within the desired channel, or which affects reception quality otherwise. In principle, such interfering signals may be suppressed by suppressing signals that cause these interfering signals. The radiofrequency filter RFF may be used to that effect. However, the more significant the nonlinear terms of the transfer function of the radiofrequency amplifier RFA are, the more complicated the radiofrequency filter RFF needs to be in order to achieve a satisfactory reception quality.

Figure 2:
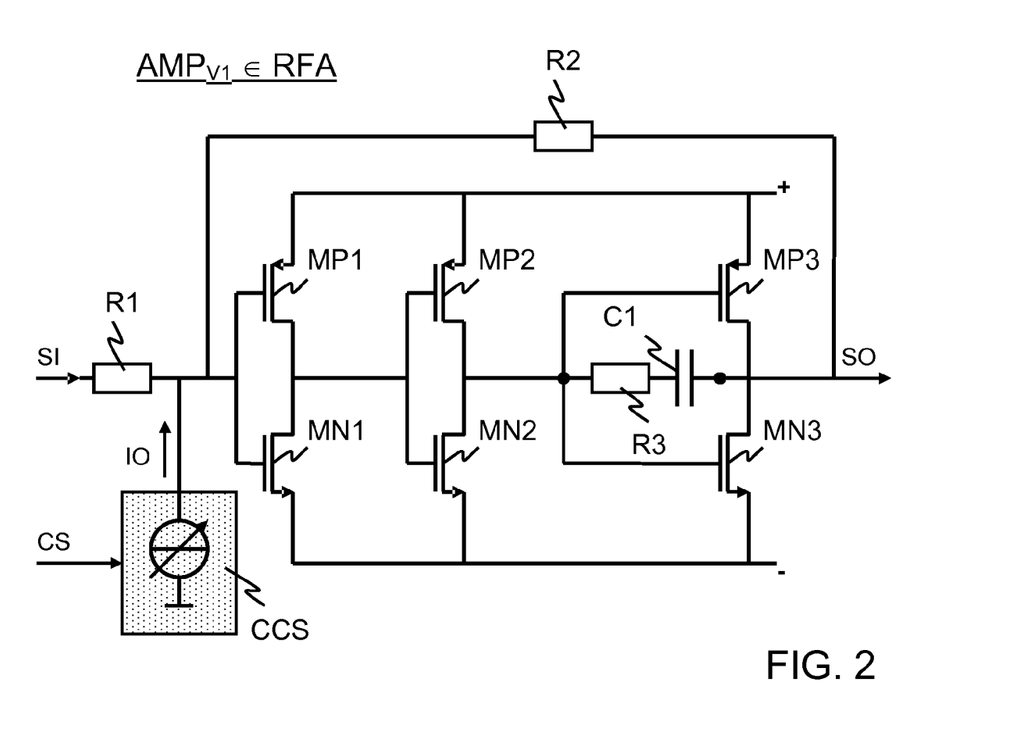
FIG. 2 is a circuit diagram that illustrates an amplifier circuit, which may form part of the radiofrequency amplifier.

FIG. 2 illustrates an amplifier circuit $AMP_{V1}$ that may form part of the radiofrequency amplifier RFA illustrated in FIG. 1. In the standard mode of operation, the amplifier circuit $AMP_{V1}$ receives an input signal SI, which may correspond with the filtered radiofrequency signal $RF_F$ illustrated in FIG. 1. The amplifier circuit $AMP_{V1}$ provides an output signal SO, which may correspond with the filtered-and-amplified radiofrequency signal $RF_{FA}$ illustrated in FIG. 1.

The amplifier circuit $AMP_{V1}$ comprises several field effect transistors having an n-type conductivity MN1, MN2, MN3 and several field effect transistors MP1, MP2, MP3 having a p-type conductivity. These field effect transistors will hereinafter be referred to as n-type field effect transistors and p-type field effect transistors, respectively, wherever appropriate. The n-type field effect transistors MN1, MN2, MN3 and the p-type field effect transistors MP1, MP2, MP3 are complementary. The field effect transistors each have a gate, a source, and a drain. The amplifier circuit $AMP_{V1}$ further comprises several resistances R1, R2, R3, a capacitance C1, and a controllable current source CCS. The amplifier circuit $AMP_{V1}$ has a positive supply line + and a negative supply line − between which a supply voltage may be present.

The amplifier circuit $AMP_{V1}$ comprises three stages: an input stage formed by field effect transistors MN1, MP1, an intermediate stage formed by field effect transistors MN2, MP2, and an output stage that comprises field effect transistors MN3, MP3. In each stage, a p-type field effect transistor and an n-type field effect transistor are coupled in series between the positive supply line + and the negative supply line −. The respective gates of these two field effect transistors are coupled to each other so as to constitute a common gate node. The respective drains of these two field effect transistors are equally coupled to each other so as to constitute a common drain node. The source of the p-type field effect transistor is coupled to the positive supply line +; the source of the n-type field effect transistor is coupled to the negative supply line −.

Each stage constitutes an elementary inverting amplifier. The common gate node constitutes an input of the elementary inverting amplifier. The common drain node constitutes an output of the elementary inverting amplifier. The input stage and the intermediate stage are topologically similar, although transistor sizes may differ. In the output stage, capacitance C1 and resistance R3, which are coupled between the input and the output, constitute a local feedback circuit. This local feedback circuit is frequency dependent. At relatively low frequencies, capacitance C1 may be regarded as an open circuit. That is, at relatively low frequencies the output stage will have a gain that is comparable with that of the input stage and the intermediate stage. At relatively high frequencies, capacitance C1 may be regarded as a short circuit. Consequently, at relatively high frequencies, resistance R3 will substantially determine the gain of the output stage, which is low compared with the gain at relatively low frequencies.

Resistance R1 and resistance R2 constitute an overall feedback circuit for the amplifier circuit $AMP_{V1}$ illustrated in FIG. 2. The overall feedback circuit causes the amplifier circuit $AMP_{V1}$ to have a relatively linear transfer function; nonlinear terms are relatively small magnitude. As a result, distortion will be relatively low. The amplifier circuit $AMP_{V1}$ has a voltage gain that can be approximated as the ratio between resistance R2 and resistance R1. The overall feedback circuit further ensures an appropriate basic direct current (DC) biasing of the amplifier circuit $AMP_{V1}$.

There is another factor that contributes to the relatively linear transfer function of the amplifier circuit $AMP_{V1}$. The amplifier circuit $AMP_{V1}$ has an open loop gain that is a relatively high because of the three stages. Each stage provides a particular gain, which constitutes a multiplicative term of the open loop gain. The amplifier circuit $AMP_{V1}$ has an open loop transfer function that, in terms of poles and zeros, comprises three poles: one pole from each stage. Resistance R3 and capacitance C1, which constitute the local feedback circuit in the output stage, account for a stabilizing zero in the transfer function. That is, resistance R3 and capacitance C1 prevent the amplifier circuit $AMP_{V1}$ from oscillating, or from exhibiting undesired transient effects.

Despite the overall feedback circuit and the relatively high loop gain, second-order distortion may be above an acceptable level, whereas third-order distortion may be sufficiently low. In principle, it is possible to reduce the second-order distortion by increasing open loop gain. This may be achieved by, for example, reducing resistance R2. However, in case resistance R2 is reduced, the voltage gain of the amplifier circuit $AMP_{V1}$ is also reduced. This may adversely affect reception quality in terms of sensitivity or signal to noise ratio or bit error ratio, whichever applies. Another way of increasing open loop gain is adding a supplementary stage. However, it will be difficult, or even impossible, to obtain a sufficiently large bandwidth, which allows amplification of radiofrequency signals, while ensuring a stable operation. In this respect, it should be noted that in case the amplifier circuit is to be extended with stages of the same kind, the number needs to be increased from 3 to 5 in order to obtain correct polarity of feedback.

It was found that second-order distortion is substantially related to manufacturing aspects and design considerations. The n-type field effect transistors MN1, MN2, MN3 and the p-type field effect transistors MP1, MP2, MP3 are formed on an integrated circuit substrate by means of different process steps. Process steps that are used to form the n-type field effect transistors may overlap with process steps that are used to form the p-type field effect transistors, but there is no complete overlap. Consequently, it is difficult to achieve that the n-type field effect transistors and the p-type field effect transistors have substantially identical analog characteristics, apart from being of opposite sign.

Moreover, other circuits may need to be formed jointly with the radiofrequency amplifier RFA on a single integrated circuit substrate. As mentioned hereinbefore with reference to FIG. 1, an integrated circuit may comprise the radiofrequency amplifier RFA as well as other, digital circuits that belong to the channel selection-and-processing arrangement CHSP. These other circuits may require that the n-type field effect transistors MN1, MN2, MN3 and the p-type field effect transistors MP1, MP2, MP3 are formed so that these transistors nominally have different analog characteristics. In addition, manufacturing tolerances may cause that the n-type field effect transistors and the p-type field effect transistors of a particular specimen have respective analog characteristics that differ to a relatively large extent. If nominally differences already exist, even greater differences may occur due to manufacturing tolerances. This may result in an insufficient performance in terms of second-order distortion, which is difficult to resolve by means of feedback as explained hereinbefore.

The amplifier circuit $AMP_{V1}$ illustrated in FIG. 2 has a quiescent operating point that can be adjusted by means of an offset current IO, which the controllable current source CCS provides. The controllable current source CCS applies the offset current IO to the input of the input stage, which corresponds with a common node of resistances R1 and R2 that form the feedback circuit. A portion of the offset current IO substantially flows through resistance R2 and effectively translates into an offset voltage at the output of the output stage. This offset voltage affects the analog characteristics of p-type field effect transistor MP3 and those of n-type field effect transistor MN3 in an opposite manner. Accordingly, the respective analog characteristics of these field effect transistors can be adjusted so as to reduce second-order distortion, as well as higher order even distortion.

The controllable current source CCS receives a control signal CS, which determines the offset current IO. The control signal CS may be in the form of, for example, a binary word that may have a value in a range comprised between, for example, 0 and 255. The controllable current source CCS may be implemented as, for example, a digital-to-analog converter. A suitable control arrangement may adjust the control signal CS so that minimum second-order distortion is achieved. The value that provides minimum second-order distortion may be determined by means of a calibration process. Alternatively, the value may be adjusted in a continuous fashion. This will be explained in greater detail hereinafter.

Figure 3:
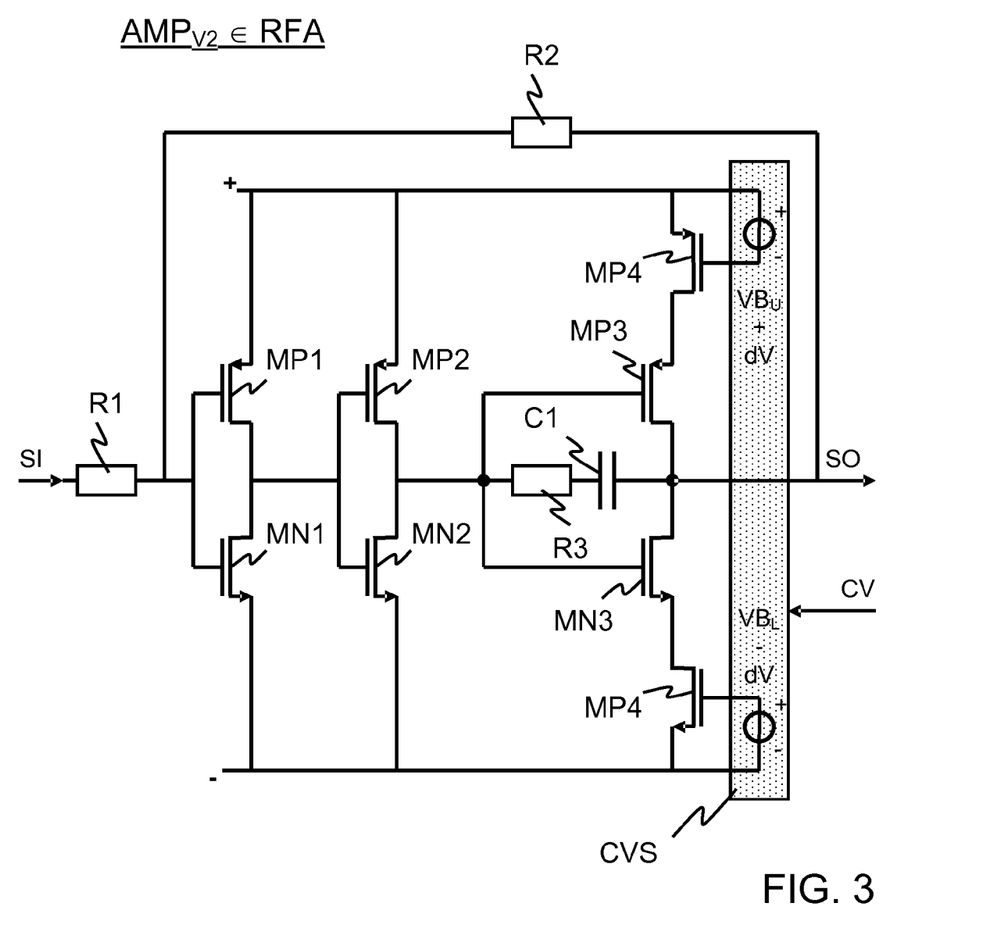
FIG. 3 is a circuit diagram that illustrates another amplifier circuit, which may form part of the radiofrequency amplifier.

FIG. 3 illustrates another amplifier circuit $AMP_{V2}$ that may form part of the radiofrequency amplifier RFA illustrated in FIG. 1. This amplifier circuit $AMP_{V2}$ has relatively many similarities with the amplifier circuit $AMP_{V1}$ illustrated in FIG. 2. For this reason, similar entities are denoted by identical reference signs and will be referred to using similar terms. For reasons of convenience, the amplifier circuits illustrated in FIGS. 2 and 3 will hereinafter be referred to as current-adjusted amplifier circuit $AMP_{V1}$ and voltage-adjusted amplifier circuit $AMP_{V2}$, respectively.

The voltage-adjusted amplifier circuit $AMP_{V2}$ illustrated in FIG. 3 comprises two additional field effect transistors: a p-type field effect transistor MP4 and an n-type field effect transistor MN4 in the output stage. The additional p-type field effect transistor MP4 has effectively been inserted between p-type field effect transistor MP3 and the positive supply line +. More specifically, the drain of the additional p-type field effect transistor MP4 is coupled to the source of p-type field effect transistor MP3. The source of the additional p-type field effect transistor MP4 is coupled to the positive supply line +. In a symmetrical fashion, the additional n-type field effect transistor MN4 has effectively been inserted between n-type field effect transistor MN3 and the negative supply line −. More specifically, the drain of the additional n-type field effect transistor MN4 is coupled to the source of n-type field effect transistor MN3. The source of the additional n-type field effect transistor MN4 is coupled to the positive supply line +.

The voltage-adjusted amplifier circuit $AMP_{V2}$ illustrated in FIG. 3 comprises a controllable complementary voltage source CVS, which functionally replaces the controllable current source CCS in the current-adjusted amplifier circuit $AMP_{V1}$ illustrated in FIG. 2. The controllable complementary voltage source CVS applies an upper bias voltage to the gate of the additional p-type field effect transistor MP4, and a lower bias voltage to the gate of the additional n-type field effect transistor MN4. The upper bias voltage is a sum of an offset voltage dV and a nominal upper bias voltage $VB_U$, when referenced with respect to the positive supply line +. The lower bias voltage is a subtraction of the offset voltage dV from a nominal lower bias voltage $VB_L$, when referenced with respect to the negative supply line −. Accordingly, the controllable complementary voltage source CVS can impose a degree of unbalance onto the output stage. The offset voltage dV on the upper bias voltage $VB_U$ and the lower bias voltage $VB_L$ determines the degree of unbalance.

The voltage-adjusted amplifier circuit $AMP_{V2}$ has thus a quiescent operating point that varies as a function of the offset voltage dV that is present on the upper bias voltage $VB_U$ and the lower bias voltage $VB_L$. A control signal CS, which is applied to the controllable complementary voltage source CVS, determines the offset voltage dV. As mentioned hereinbefore with respect to the current-adjusted amplifier circuit $AMP_{V1}$, a suitable control arrangement may adjust the control signal CS so that minimum second-order distortion is achieved.

Figure 4:
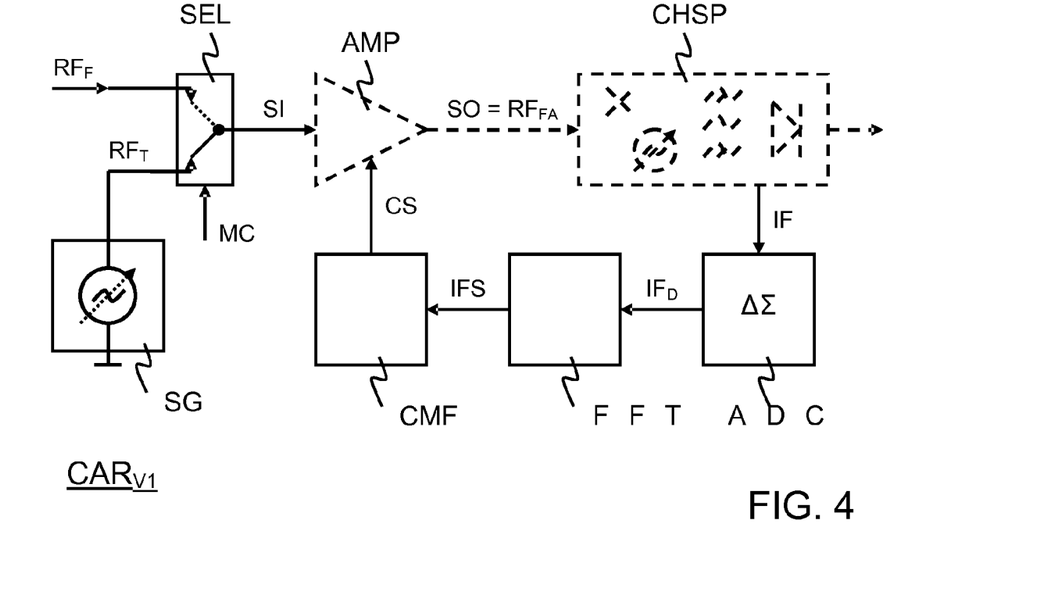
FIG. 4 is a block diagram that illustrates a control arrangement for the radiofrequency amplifier.

FIG. 4 illustrates a control arrangement $CAR_{V1}$ for the radiofrequency amplifier RFA illustrated in FIG. 1. The control arrangement $CAR_{V1}$ comprises a signal generator SG, a selector SEL, an analog-to-digital converter ADC, a Fourier transform module FFT, and a frequency-sensitive control module CMF. The analog-to-digital converter ADC may be, for example, of the Sigma Delta type. The Fourier transform module FFT and the frequency-sensitive control module CMF are functional entities that may each be implemented by means of, for example, a set of instructions that have been loaded into a programmable processor. In such a software-based implementation, the set of instructions defines operations that the functional entity concerned carries out, which will be described hereinafter. FIG. 4 further illustrates other entities of the receiver system RSY for reasons of clarity: an amplifier circuit AMP that forms part of the radiofrequency amplifier RFA, and the channel selection-and-processing arrangement CHSP. The amplifier circuit AMP may be the current-adjusted amplifier circuit $AMP_{V1}$ illustrated in FIG. 2, or the voltage-adjusted amplifier circuit $AMP_{V2}$ illustrated in FIG. 3, or another functionally equivalent amplifier circuit.

The control arrangement $CAR_{V1}$ may be active in a calibration mode. The controller CTRL illustrated in FIG. 1 may set the receiver system RSY in the calibration mode, for example, whenever the receiver system RSY switched on or whenever the user switches from one channel to another. The controller CTRL may maintain the receiver system RSY in the calibration mode for a predetermined duration before switching to the standard mode of operation. The controller CTRL may also maintain the receiver system RSY in the calibration mode until the control arrangement $CAR_{V1}$ signals that a calibration cycle has successfully been completed. In that case, a maximum duration may apply for the calibration mode.

The control arrangement $CAR_{V1}$ basically operates as follows. The signal generator SG provides a radiofrequency test signal $RF_T$, which may be a single tone test signal that comprises a single frequency component. The radiofrequency test signal $RF_T$ may also be a multi-tone test signal that comprises several frequency components. A mode control signal MC, which may emanate from the controller CTRL illustrated in FIG. 1, sets the selector SEL in a calibration position. In this position, the selector SEL applies the radiofrequency test signal $RF_T$ to the amplifier circuit AMP as input signal SI. The channel selection-and-processing arrangement CHSP receives the output signal SO of the amplifier circuit AMP, as if this output signal SO were the filtered-and-amplified radiofrequency signal $RF_{FA}$ mentioned hereinbefore. The output signal SO comprises one or more second order distortion components depending on whether a single tone test signal or a multi-tone test signal is used, respectively.

The controller CTRL tunes the channel selection-and-processing arrangement CHSP to a second order distortion component so that an intermediate frequency signal IF is obtained, which comprises a frequency-shifted version of the second order distortion component. The analog-to-digital converter ADC converts the intermediate frequency signal IF, which is analog, into a digital intermediate frequency signal $IF_D$. The Fourier transform module FFT converts the digital intermediate frequency signal $IF_D$ into a digital intermediate frequency spectrum IFS, which is a frequency domain representation of the digital intermediate frequency signal $IF_D$.

The frequency-sensitive control module CMF seeks to minimize the second order distortion component in the digital intermediate frequency spectrum IFS by adjusting the value of the control signal CS that is applied to the amplifier circuit AMP. The frequency-sensitive control module CMF may do so in various different manners. In principle, the frequency-sensitive control module CMF may test each possible value so as to determine the value for which the second order distortion is minimal. Preferably, the frequency-sensitive control module CMF applies an efficient minimum-seeking control strategy, which allows finding an appropriate value of the control signal CS in a relatively few number of iterations. In any case, the frequency-sensitive control module CMF retains a value for which the second order distortion component is sufficiently small magnitude. The frequency-sensitive control module CMF applies this value to the amplifier circuit AMP during the standard mode of operation. The value is maintained until the controller CTRL switches the receiver system RSY to the calibration mode a subsequent time.

Figure 5:
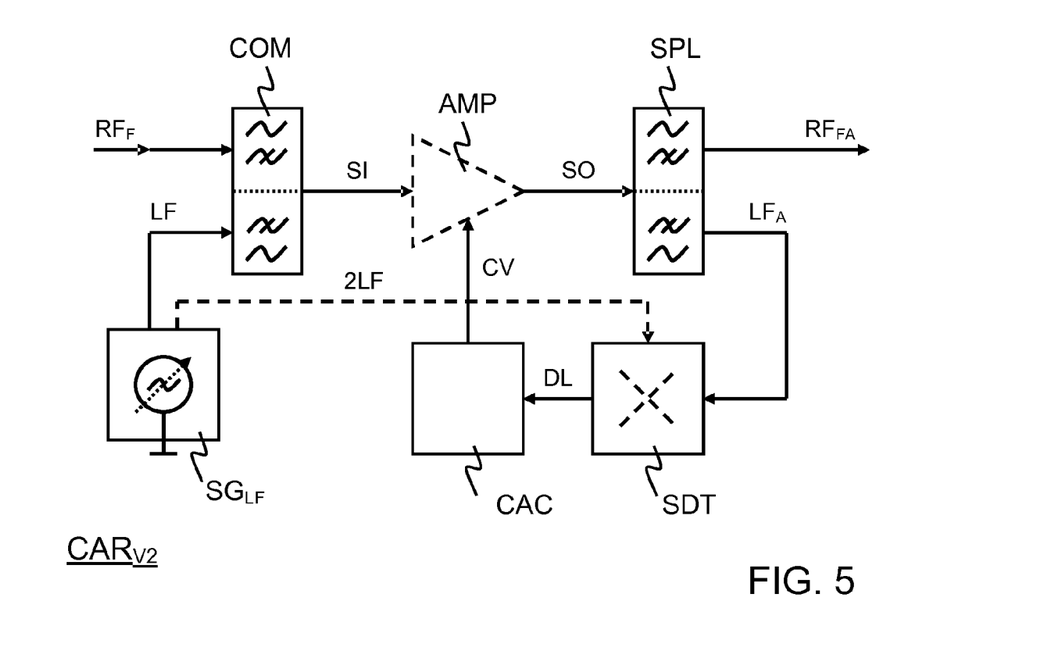
FIG. 5 is a block diagram that illustrates another control arrangement for the radiofrequency amplifier.

FIG. 5 illustrates another control arrangement $CAR_{V2}$ for the radiofrequency amplifier RFA illustrated in FIG. 1. For reasons of convenience, this control arrangement will be referred to as low frequency control arrangement $CAR_{V2}$ hereinafter, whereas the control arrangement illustrated in FIG. 4 will be referred to as radiofrequency control arrangement $CAR_{V1}$. The low frequency control arrangement $CAR_{V2}$ comprises a low frequency signal generator $SG_{LF}$, a frequency selective signal combiner COM, a frequency selective signal splitter SPL, a synchronous detector SDT, and a level-sensitive control module CML. The level-sensitive control module CML may be implemented by means of, for example, a set of instructions that has been loaded into a programmable processor. In such a software-based implementation, the set of instructions defines operations that the level-sensitive control module CML carries out, which will be described hereinafter. Like FIG. 4, FIG. 5 further illustrates the amplifier circuit AMP that forms part of the radiofrequency amplifier RFA. As mentioned hereinbefore, the amplifier circuit AMP may be the current-adjusted amplifier circuit $AMP_{V1}$ illustrated in FIG. 2, or the voltage-adjusted amplifier circuit $AMP_{V2}$ illustrated in FIG. 3, or another functionally equivalent amplifier circuit.

The low frequency control arrangement $CAR_{V2}$ basically operates as follows. The low frequency signal generator $SG_{LF}$ provides a low frequency test signal LF, which has a frequency that may be several orders of magnitude lower than of the desired channel within the filtered radiofrequency signal $RF_F$. For example, the frequency of low frequency test signal LF may be 500 kilohertz (kHz), whereas the frequency of the desired channel may be 500 Megahertz (MHz). The frequency selective signal combiner COM may add the low frequency test signal LF to the filtered radiofrequency signal $RF_F$ so as to obtain the input signal SI for the amplifier circuit AMP. The frequency selective signal splitter SPL splits the output signal SO of the amplifier circuit AMP into two components: the filtered-and-amplified radiofrequency signal $RF_{FA}$ and an amplified version of the low frequency test signal $LF_A$. The frequency selective signal splitter SPL can be of relatively simple structure thanks to a frequency difference that is several orders of magnitude.

The synchronous detector SDT receives the amplified version of the low frequency test signal $LF_A$, which may comprise a second harmonic. The synchronous detector SDT provides a detection level signal DL, which has a magnitude that is representative of that of the second harmonic. To that end, the synchronous detector SDT may comprise a multiplier, which receives a second harmonic signal from the low frequency signal generator $SG_{LF}$. The low frequency signal generator $SG_{LF}$ may comprise, for example, an oscillator that operates at twice the frequency of the low frequency test signal LF. The second harmonic signal may directly be derived from this oscillator, whereas the low frequency test signal LF is obtained by a frequency division by two.

The level-sensitive control module CML seeks to minimize the magnitude of the second harmonic in the amplified version of the low frequency test signal $LF_A$ by adjusting the value of the control signal CS that is applied to the amplifier circuit AMP. The level-sensitive control module CML may do so in various different manners, some of which may be similar to those described hereinbefore with respect to the frequency-sensitive control module CMF. The level-sensitive control module CML may also comprise a comparator that compares the detection level signal DL with a desired zero value.

The optimal value of the control signal CS, for which the second order distortion is minimal, changes very little with frequency in case signals of interest have frequencies that are relatively low compared with transistor transit frequencies. In such implementations second order distortion is relatively frequency independent. Consequently, in case the amplifier circuit AMP is adjusted so that second order distortion is relatively low at relatively low frequencies, the amplifier circuit AMP equally exhibits a relatively low second order distortion at relatively high frequencies. Adjusting the amplifier circuit AMP at relatively low frequencies can be achieved in a relatively simple and cost-efficient fashion. Moreover, it was found that the optimal value of the control signal CS changes very little with temperature. Accordingly, it is not necessary to regularly place the receiver system RSY in the calibration mode or to monitor any temperature changes for the purpose of maintaining a relatively low second order distortion.

In principle, the low frequency control arrangement $CAR_{V2}$ illustrated in FIG. 5 may operate continuously. That is, the low frequency control arrangement $CAR_{V2}$ may operate while the radiofrequency amplifier RFA amplifies the filtered radiofrequency signal $RF_F$ so as to apply the filtered-and-amplified radiofrequency signal $RF_{FA}$ to the channel selection-and-processing arrangement CHSP. However, the low frequency test signal LF may potentially cause interference because, for example, this signal consumes a portion of available dynamic range. It may therefore be preferable to activate the low frequency control arrangement $CAR_{V2}$ only when an adjustment might be needed, similar to placing the radiofrequency control arrangement $CAR_{V1}$ illustrated in FIG. 4 in the calibration mode as discussed hereinbefore.

CONCLUDING REMARKS

The detailed description hereinbefore with reference to the drawings is merely an illustration of the invention and the additional features, which are defined in the claims. The invention can be implemented in numerous different ways. In order to illustrate this, some alternatives are briefly indicated.

The invention may be applied to advantage in numerous types of products or methods that involve signal amplification. For example, the invention may be applied to advantage in a transmitter system or in a measurement system.

There are numerous ways of implementing an amplifier in accordance with the invention. Although FIGS. 2 and 3 illustrate examples of amplifiers that comprise 3 stages, an amplifier in accordance with the invention may comprise a different number of stages, such as, for example, 2 stages, 4 stages, or only a single stage. A feedback circuit is preferable but not essential. Any type of feedback circuit may be used. For example, an amplifier in accordance with the invention may comprise a shunt feedback circuit as well as a series feedback circuit. Such a combination of feedback circuits allows a well defined, low noise input impedance. Field effect transistors may be of the CMOS type. However, junction field effect transistors, as well as other type of field effect transistors, may also be used. Bipolar transistors may also be used.

There are numerous ways of implementing a suitable controllable biasing circuit. For example, referring to FIG. 3, the additional field effect transistors may be replaced by controllable voltage sources. Referring to FIG. 2, an offset current or an offset voltage may be applied to signal nodes other than the input of the amplifier circuit $AMP_{V1}$. A controllable biasing circuit may also be in the form of a separate power supply circuit for the output stage of the amplifier. Such an implementation may be obtained, for example, by applying the following modifications to the amplifier circuit $AMP_{V2}$ illustrated in FIG. 3. The controllable complementary voltage source CVS is replaced by a controllable power supply circuit that applies an adjustable power supply voltage to field-effect transistors MP3, MN3, which form the output stage. The input stage and the intermediate stage receive another power supply voltage, which may be fixed, from another power supply circuit via the supply lines +, −. The adjustable power supply voltage, which is applied to the output stage, varies as a function of the control signal CS with respect to the supply voltage that is applied to the input stage and intermediate stage as a function of the control signal CS. An advantage of such an implementation with respect to that illustrated in FIG. 3 is that a relatively low output impedance can be obtained.

There are numerous ways of implementing a suitable control arrangement. For example, the control arrangement $CAR_{V1}$ illustrated in FIG. 4 may be modified as follows. The analog-to-digital converter ADC, the Fourier transform module FFT, and the frequency-sensitive control module CMF are replaced by entities similar to the synchronous detector SDT and the level-sensitive control module CML illustrated in FIG. 5. As another example, a signal processing arrangement in accordance with the invention may comprise several identical amplifiers, one of which is specifically dedicated for establishing the control signal. This amplifier receives a test signal for the purpose of measuring even order distortion. The control signal, which causes the even order distortion to be below the critical level, is equally applied to the other amplifiers. Such a configuration allows a continuous control with little risk of interference.

The term "transistor" should be understood in a broad sense. The term includes any component capable of signal amplification.

Although a drawing shows different functional entities as different blocks, this by no means excludes implementations in which a single entity carries out several functions, or in which several entities carry out a single function. In this respect, the drawings are very diagrammatic. For example, referring to FIGS. 1 and 4, the Fourier transform module FFT and the frequency-sensitive control module CMF may be implemented by means of processor, which is also implements the controller CTRL.

There are numerous ways of implementing functional entities by means of hardware or software, or a combination of both. As mentioned hereinbefore with reference to FIG. 4, the Fourier transform module FFT and the frequency-sensitive control module CMF are functional entities that may each be implemented by means of a set of instructions that has been loaded into a programmable processor. In this respect, FIG. 4 can be regarded to represent a method, whereby the Fourier transform module FFT represents a measurement step and the frequency-sensitive control module CMF represents a control step. Although software-based implementations of these functional entities have been mentioned, hardware-based implementations are by no means excluded. Hybrid implementations are also possible in the sense that a system, or a functional entity comprises therein, comprises one or more dedicated circuits as well as one or more suitably programmed processors.

The remarks made herein before demonstrate that the detailed description with reference to the drawings, illustrate rather than limit the invention. There are numerous alternatives, which fall within the scope of the appended claims. Any reference sign in a claim should not be construed as limiting the claim. The word "comprising" does not exclude the presence of other elements or steps than those listed in a claim. The word "a" or "an" preceding an element or step does not exclude the presence of a plurality of such elements or steps. The mere fact that respective dependent claims define respective additional features, does not exclude a combination of additional features, which corresponds to a combination of dependent claims.

The invention claimed is:

1. A signal processing arrangement comprising:
   an amplifier that includes a stage with complementary transistors of opposite conductivity type arranged in series between two supply lines;
   a controllable biasing circuit adapted to change a quiescent operating point of the stage as a function of a control signal;
   a control arrangement adapted to measure an even order distortion of the amplifier and to adjust the control signal so that the even order distortion is below a critical level; and
   a controller adapted to set the signal processing arrangement in a calibration mode in which the control arrangement is allowed to adjust the control signal, and a standard mode in which the control signal is maintained at a value for which the even order distortion is below the critical level.

2. A signal processing arrangement according to claim 1, the control arrangement comprising:
   a signal generator for applying a test signal to the amplifier on a basis of which the even order distortion is measured, the test signal comprising a frequency that is several orders of magnitude lower than that of a typical signal, which the amplifier has to amplify.

3. A signal processing arrangement according to claim 1, the controllable biasing circuit comprising a controllable current source for applying a controllable offset current to a signal node of the amplifier.

4. A signal processing arrangement according to claim 1, the controllable biasing circuit comprising at least one controllable biasing element arranged in series with the two complementary transistors between the two supply lines, so as to impose a controllable difference between respective biasing voltages across the two respective complementary transistors.

5. A signal processing arrangement according to claim 1, the amplifier comprising a feedback circuit.

6. A signal processing arrangement according to claim 5, the feedback circuit comprising a resistance coupled between an output and an input of the amplifier, the controllable biasing circuit comprising a controllable current source for applying a controllable offset current to the input of the amplifier.

7. A signal processing arrangement according to claim 1, wherein the stage of the amplifier comprises an input stage, an intermediate stage, and an output stage, each with complementary transistors of opposite conductivity type arranged in series between two supply lines, wherein the controllable biasing circuit is adapted to change the quiescent operating point of the output stage as a function of the control signal.

8. A signal processing arrangement according to claim 7, at least one of the aforementioned stages being provided with a local feedback circuit that comprises a resistance and a capacitance coupled in series.

9. A radiofrequency system comprising a signal processing arrangement according to claim 1 for amplifying a radio frequency signal.

10. A signal processing arrangement comprising:
an amplifier that includes a stage with complementary transistors of opposite conductivity type arranged in series between two supply lines;
a controllable biasing circuit adapted to change a quiescent operating point of the stage as a function of a control signal; and
a control arrangement adapted to measure an even order distortion of the amplifier and to adjust the control signal so that the even order distortion is below a critical level;
the control arrangement comprising:
a signal generator for applying a test signal to the amplifier on a basis of which the even order distortion is measured, the test signal comprising a frequency that is several orders of magnitude lower than that of a typical signal, which the amplifier has to amplify.

11. A signal processing arrangement comprising:
an amplifier that includes a stage with complementary transistors of opposite conductivity type arranged in series between two supply lines;
a controllable biasing circuit adapted to change a quiescent operating point of the stage as a function of a control signal; and
a control arrangement adapted to measure an even order distortion of the amplifier and to adjust the control signal so that the even order distortion is below a critical level;
the controllable biasing circuit comprising a controllable current source for applying a controllable offset current to a signal node of the amplifier.

12. A signal processing arrangement comprising:
an amplifier that includes a stage with complementary transistors of opposite conductivity type arranged in series between two supply lines;
a controllable biasing circuit adapted to change a quiescent operating point of the stage as a function of a control signal; and
a control arrangement adapted to measure an even order distortion of the amplifier and to adjust the control signal so that the even order distortion is below a critical level;
the controllable biasing circuit comprising at least one controllable biasing element arranged in series with the two complementary transistors between the two supply lines, so as to impose a controllable difference between respective biasing voltages across the two respective complementary transistors.

13. A signal processing arrangement comprising:
an amplifier that includes a stage with complementary transistors of opposite conductivity type arranged in series between two supply lines;
a controllable biasing circuit adapted to change a quiescent operating point of the stage as a function of a control signal; and
a control arrangement adapted to measure an even order distortion of the amplifier and to adjust the control signal so that the even order distortion is below a critical level;
wherein the stage of the amplifier comprises an input stage, an intermediate stage, and an output stage, each with complementary transistors of opposite conductivity type arranged in series between two supply lines, wherein the controllable biasing circuit is adapted to change the quiescent operating point of the output stage as a function of the control signal;
at least one of the aforementioned stages being provided with a local feedback circuit that comprises a resistance and a capacitance coupled in series.

* * * * *